(12) United States Patent
Churchill et al.

(10) Patent No.: US 6,388,927 B1
(45) Date of Patent: May 14, 2002

(54) DIRECT BIT LINE-BIT LINE DEFECT DETECTION TEST MODE FOR SRAM

(75) Inventors: Jonathan F. Churchill, Reading (GB); Jeffrey F. Kooiman, Bloomington, MN (US); Cathal G. Phelan, Los Altos, CA (US); Ashish S. Pancholy, Milpitas, CA (US); Gary A. Gibbs, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/792,102

(22) Filed: Feb. 23, 2001

(51) Int. Cl.[7] .................................................. G11C 7/00
(52) U.S. Cl. .................... 365/201; 365/200; 365/189.09
(58) Field of Search ................................. 365/201, 200, 365/189.09, 241, 242, 190

(56) References Cited

U.S. PATENT DOCUMENTS 5,331,594 A * 7/1994 Hotta .......................... 365/201
5,892,720 A * 4/1999 Stave et al. ................. 365/201
6,212,115 B1 * 4/2001 Jordan ......................... 365/201

* cited by examiner

*Primary Examiner*—David Nelms
*Assistant Examiner*—David Lam
(74) *Attorney, Agent, or Firm*—Kevin L. Daffer; Conley, Rose & Tayon P.C.

(57) ABSTRACT

A system and method are disclosed herein for leakage testing of a static random access memory (SRAM) semiconductor memory device. Subtle leakage defects may be present in some devices in the early stages of SRAM production. These defects may later result in hard failures when packaged devices are burned in, but are not detected by functional tests performed during wafer sort. The leakage defects are associated with complementary bit line pairs within the SRAM matrix, and may be revealed by leakage current measurements made between all of the complementary bit line pairs within the SRAM. Comparatively minor modifications to the internal circuitry of the SRAM enable the leakage measurements to be performed during wafer sort, so defective devices can be screened out prior to packaging, lead-bonding, etc.

22 Claims, 8 Drawing Sheets

DIRECT BIT LINE-BIT LINE DEFECT DETECTION TEST MODE FOR SRAM

BACKGROUND OF THE INVENTION

1. Field of the Invention

This invention relates to semiconductor memory devices, and more particularly to a system and method for testing semiconductor memory devices, prior to burn-in. Described herein are means for detecting device defects in the wafer sorting stage of production. Many such defects typically manifest themselves as hard failures in later production stages during operation at high temperatures, high voltages, or other types of stress testing. By screening these devices in early production, manufacturing costs are reduced and yields improved.

2. Description of the Related Art

The proliferation of computers and other microprocessor-based devices has contributed to an increasing demand for semiconductor memory. Microprocessors are present not only in computers, but in a diverse range of products including automobiles, cellular telephones and kitchen appliances. A conventional microprocessor executes a sequence of instructions and processes information. Frequently, both the instructions and the information reside in semiconductor memory. Therefore, an increased requirement for memory has accompanied the microprocessor boom. Furthermore, as microprocessors have become more sophisticated, greater capacity and speed are demanded from the associated memory.

There are various types of semiconductor memory, including Read Only Memory (ROM) and Random Access Memory (RAM). ROM is typically used where instructions or data must not be modified, while RAM is used to store instructions or data which must not only be read, but modified. ROM is a form of non-volatile storage—i.e., the information stored in ROM persists even after power is removed from the memory. On the other hand, RAM storage is generally volatile, and must remain powered-up in order to preserve its contents.

A conventional semiconductor memory device stores information digitally, in the form of bits (i.e., binary digits). The memory is typically organized as a matrix of memory cells, each of which is capable of storing one bit. The cells of the memory matrix are accessed by word lines and bit lines. Word lines are typically associated with the rows of the memory matrix, and bit lines with the columns. Raising a word line activates a given row; the bit lines are then used to read from or write to the corresponding cells in the currently active row. Memory cells are typically capable of assuming one of two voltage states (commonly described as "on" or "off"). Information is stored in the memory by setting each cell in the appropriate logic state. For example, to store a bit having the value 1 in a particular cell, one would set the state of that cell to "on"; similarly, a 0 would be stored by setting the cell to the off state. (Obviously, the association of on with 1 and off with 0 is arbitrary, and could be reversed.)

The two major types of semiconductor RAM, Static Random Access Memory (SRAM) and Dynamic Random Access Memory (DRAM), differ in the manner by which their cells represent the state of a bit. In an SRAM, each memory cell includes transistor-based circuitry that implements a bi-stable latch. A bi-stable latch relies on transistor gain and positive (i.e. reinforcing), feedback to guarantee that it can only assume one of two states—on or off. The latch is stable in either state (hence, the term "bi-stable"). It can be induced to change from one state to the other only through the application of an external stimulus; left undisturbed, it will remain in its original state indefinitely. This is just the sort of operation required for a memory circuit, since once a bit value has been written to the memory cell, it will be retained until it is deliberately changed.

In contrast to the SRAM, the memory cells of a DRAM employ a capacitor to store the on/off voltage state representing the bit. A transistor-based buffer drives the capacitor. The buffer quickly charges or discharges the capacitor to change the state of the memory cell, and is then disconnected. Ideally, the capacitor then holds the charge placed on it by the buffer and retains the stored voltage level.

DRAMs have at least two drawbacks compared to SRAMs. The first of these is that leakage currents within the semiconductor memory are unavoidable, and act to limit the length of time the memory cell capacitors can hold their charge. Consequently, DRAMs typically require a periodic refresh cycle to restore sagging capacitor voltage levels. Otherwise, the capacitive memory cells would not maintain their contents. Secondly, changing the state of a DRAM memory cell requires charging or discharging the cell capacitor. The time required to do this depends on the amount of current the transistor-based buffer can source or sink, but generally cannot be done as quickly as a bi-stable latch can change state. Therefore, DRAMs are typically slower than SRAMs. DRAMs offset these disadvantages by offering higher memory cell densities, since the capacitive memory cells are intrinsically smaller than the transistor-based cells of an SRAM.

SRAMs are widely used in applications where speed is of primary importance, such as cache memory supporting the Central Processing Unit (CPU) in a personal computer. Like most semiconductor devices, SRAMs are fabricated en masse on semiconductor wafers, and subsequently sectioned and packaged. Early in the production process, a wafer sort test is performed. During this step, the individual SRAMs are electrically tested before sectioning the wafer. Any bad SRAMs that are identified at this stage will be discarded when the wafer is sectioned, thus avoiding the cost of packaging them.

Although the wafer sort succeeds in detecting hard failures, such as shorted address lines, there are more subtle defects that can go undetected until the SRAM is subjected to temperature cycling, operation at elevated voltages, or other types of stress testing. Among these is leakage between adjacent bit lines. Bit line-bit line leakage is often insufficient to cause the SRAM to fail preliminary functional testing during wafer sort, but tends to worsen with prolonged exposure to higher temperatures or higher voltages. Eventually, the magnitude of the leakage is great enough to cause the device to fail. Consequently, although bit line-bit line leakage is not presently detectable during wafer sort, it is thought to be a precursor to SRAM failures occurring during burn-in. Clearly, it would be desirable to have a method of detecting devices prone to this failure mode before going to the expense and trouble of packaging the SRAMs.

SUMMARY OF THE INVENTION

The problems outlined above may be addressed by a system and method disclosed herein for bit line-bit line defect detection in a semiconductor memory device. In the embodiments considered herein, the semiconductor memory device is a static random access memory (SRAM) device, but it is believed that the principles disclosed herein are applicable to other types of memory devices, as well. In fact, any memory device having adjacent bit lines may be suitable. As discussed herein, a semiconductor memory device is organized as an array of cells. The rows of the memory array may be accessed using word lines, and the columns (i.e., individual bits) may be accessed using complementary bit line pairs, each including lines BL and BLB. Thus, each combination of a word line and a bit line pair specifies an individual cell. SRAM memory cells may have complementary outputs (i.e., whenever one output is at logic level 1 the other is at logic level 0, and vice versa), each of which is coupled to one of the bit lines in the associated pair.

A system for testing a semiconductor memory device is disclosed herein, including first and second pairs of common lines, and first and second sets of bit lines. During leakage testing, the first common line may be connected to each of the first set of bit lines, and the other to each of the second set of bit lines. A voltage source applied between the common lines induces a current, the magnitude of which is related to the leakage resistance between adjacent bit lines. The bit lines are interleaved, such that each bit line from the first set is adjacent to a bit line from the second set. Moreover, each bit line from the first set is coupled to a first output of a respective memory cell, while each bit line from the second set is coupled to a second output of the memory cell. Furthermore, each of the first set of bit lines is connected to the first common line and each of the second set of bit lines is connected to the second common line, only when a test signal is active; at other times, first and second common lines are unconnected to the bit lines, and are instead connected to a fixed voltage by first and second shunt elements, respectively. Prior to performing a leakage measurement, all the cells within the semiconductor memory device are preset, such that the polarity of each of the first set of bit lines with respect to the adjacent bit line from the second set is the same as the polarity of the voltage source applied between the first and second common lines.

A method for testing a semiconductor memory device is also disclosed herein, including connecting first and second common lines to first and second sets of bit lines, respectively, and then measuring a resistance between the first and second common lines. In an embodiment of this method, the first and second sets of bit lines are interleaved, such that each bit line from the first set is adjacent to a bit line from the second set. Switches may be used to connect the bit lines from the first and second sets to first and second common lines, respectively, only when a test signal is active. In an embodiment, measuring constitutes applying. a voltage between the first and second common lines and measuring any resulting current. The voltage may be externally applied, or may originate from a voltage source within the memory device itself. In an embodiment of this method, first and second bit lines are coupled to complementary first and second outputs of a bi-stable latch within each memory cell, and the applied test voltage is approximately equal to the voltage across the latch. Prior to applying the test voltage, the memory cells are preset to the same logical value. In another embodiment, the first and second common lines are clamped to a fixed voltage, except during testing, by means of shunt devices within the memory device that are deactivated by the test signal.

A method for testing a semiconductor memory device is also disclosed, consisting of measuring the resistance between adjacent bit lines within the memory, prior to performing a stress test on the memory device. In an embodiment of this method, first and second sets of bit lines are coupled to first and second common lines, respectively, within the memory device, and then the resistance between the two common lines is measured.

A semiconductor memory device is also disclosed. In an embodiment, the semiconductor device contains an array of interleaved bit lines, with odd-numbered bit lines belonging to a first set and even-numbered bit lines belonging to a second set. A further feature of this embodiment is a complementary pair of common lines, such that the first common line is coupled to all the bit lines in the first set and the second common line is coupled to all the bit lines in the second set. Further, each bit line is coupled to a switch, which electrically connects the bit line to its respective common line only when a test signal is active. In one embodiment, the common lines are brought out to pads, allowing the application of an external voltage source to measure resistance between the common lines. Another embodiment of the semiconductor memory device disclosed herein is in the form of an integrated circuit.

BRIEF DESCRIPTION OF THE DRAWINGS

Other objects and advantages of the invention will become apparent upon reading the following detailed description and upon reference to the accompanying drawings in which.

Figure 1:
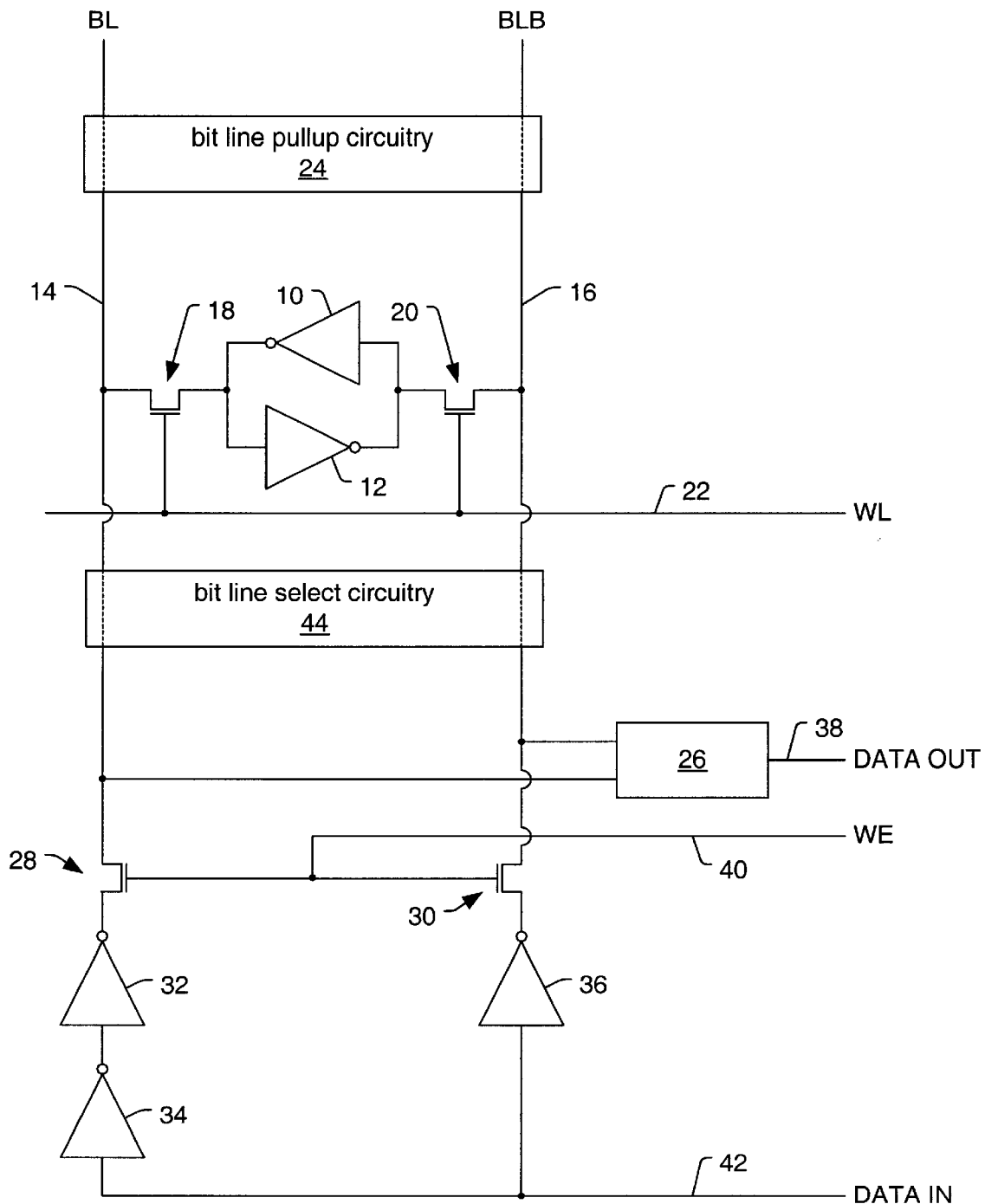
FIG. 1 shows the organization of a standard SRAM memory cell.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

As noted above, SRAMs are a widely used type of semiconductor memory device. These memories are commonly employed where fast memory access is necessary (such as in computer caches) or in embedded applications, where the complexity of a DRAM memory interface is unwarranted. The functional structure of a typical SRAM memory cell is shown in FIG. 1.

In FIG. 1, cross-coupled inverters 10 and 12 comprise a bi-stable latch. (Note that these devices are actually fabricated from discrete transistors. However the schematic representation used in FIG. 1 is more suggestive of their operation.) It will be seen that the output of each inverter provides positive feedback to the input of the other. For example, if the input of inverter 10 goes High, its output goes Low. This drives the input of inverter 12 Low, reinforcing the High at the input of inverter 10. As a result, the latch is capable of retaining a logic state, enabling it to serve as a storage element. The logic state of the latch is brought out to a pair of complementary bit lines BL 14 and BLB 16. Bit lines 14 and 16 are controlled by word line (WL) 22 via a pair of pass transistors 18 and 20. When word line 22 is Low, the pass transistors are turned off, isolating the latch. When word line 22 is High, pass transistor 18 connects the output of inverter 10 to bit line BL 14; likewise, pass transistor 20 connects the output of inverter 12 to bit line BLB 16. Additional circuitry is also associated with the bit lines for selection 44 and pullup 24 functions.

During read operations, the write enable (WE) signal 40 is Low. This disables pass transistors 28 and 30, effectively disconnecting inverting buffer amplifiers 32, 34 and 36 from the rest of the circuitry. In order to read the cell, the voltage difference between the two complementary bit lines 14 and 16 is buffered by a differential sense amplifier 26 to appear as a 1 or 0 at the data output 38. Although it requires more circuitry than directly sensing a single bit line, this differential to single-ended voltage conversion provides very high noise immunity. During write operations, WE 40 goes High, allowing pass transistor 28 to connect inverting drivers 32 and 34 to bit line BL 14; similarly, pass transistor 30 connects inverting driver 36 to complementary bit line BLB 16. The inverting drivers buffer the logic state on data input 42 and store this state in the bi-stable latch by overriding the inverters 10 and 12. Assume, for example, that the output of inverter 10 is High, that write enable line 40 is High, and that the data input 42 is Low. Drivers 32 and 34, connected through pass transistors 28 and 18, will overcome inverter 10, pulling it Low and changing the state of the latch. Once this has been accomplished, pass transistors 18 and 20 may be turned off, and the latch retains the new state by virtue of positive feedback, as described above.

Like most semiconductor devices, SRAMs are mass-produced, with multiple memory devices being created on a single silicon wafer. The wafer is subsequently sectioned to separate the SRAMs, and the individual devices are placed in packages with attached leads. Prior to sectioning the wafer, a functional test is performed on the memory devices to eliminate faulty SRAMs before they are packaged. This step is commonly referred to as "wafer sort." Although wafer sort is an effective means of removing devices with "hard" failures, it does not detect a variety of pre-failure conditions, which result in failures only after the device has undergone burn-in, or stress testing.

One such pre-failure condition is believed to be leakage between adjacent bit lines. These leakage currents are initially small, but when the SRAM is operated for extended periods at elevated temperatures or voltages (as is done during burn-in), the leakage currents can increase to the point where the SRAM no longer passes functional tests. Present wafer sort test methods do not detect bit line-bit line leakage. As a result, many potentially faulty devices are passed through to subsequent stages of production, only to eventually fail. This adversely affects device yields and production costs.

A system and method are disclosed herein for detecting bit line-bit line defects in SRAM memory devices during wafer sort. This system and method are believed to provide means for improving SRAM quality and yield by eliminating faulty devices in the early stages of production.

Figure 2:
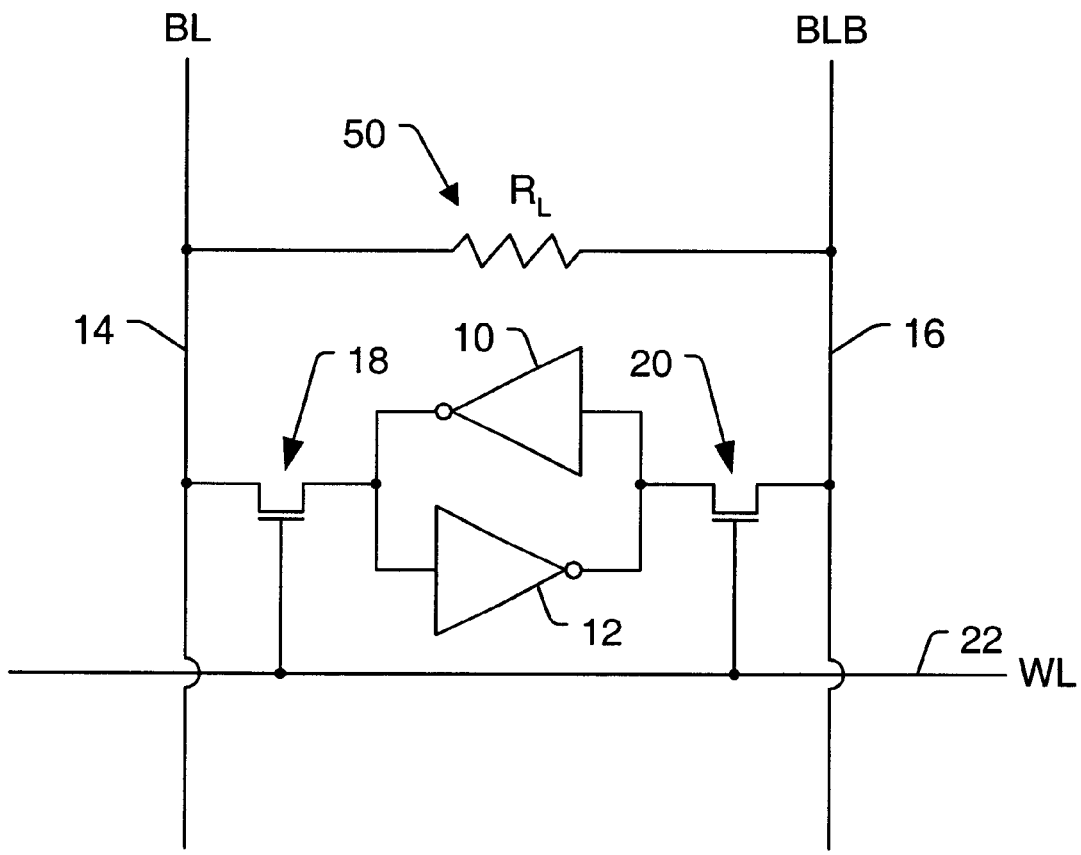
FIG. 2 represents the bi-stable latch of FIG. 1 in the presence of bit line-bit line leakage.

FIG. 2 illustrates the bit line-bit line leakage problem in a typical SRAM memory cell. FIG. 2 shows the circuitry immediately surrounding the bi-stable latch in FIG. 1. (Elements appearing in more than one figure retain the same item numbers throughout the figures.) Note that in addition to the components comprising the memory cell (i.e., inverters 10 and 12, and pass transistors 18 and 20), a leakage resistance $R_L$ 50 is shown connected between complementary bit lines BL 14 and BLB 16. This resistance represents a defect in the SRAM that would escape detection during wafer sort. The defect could be in the form of, for example, a particle between lines 14 and 16. Other possibilities include partial metal traces or insulator pinholes/voids. The leakage resistance may initially be high enough not to impair operation of the memory. However, this resistance often decreases with prolonged operation at high temperatures or voltages, and may ultimately short circuit bit lines BL 14 and BLB 16, resulting in failure of the SRAM.

Figure 3:
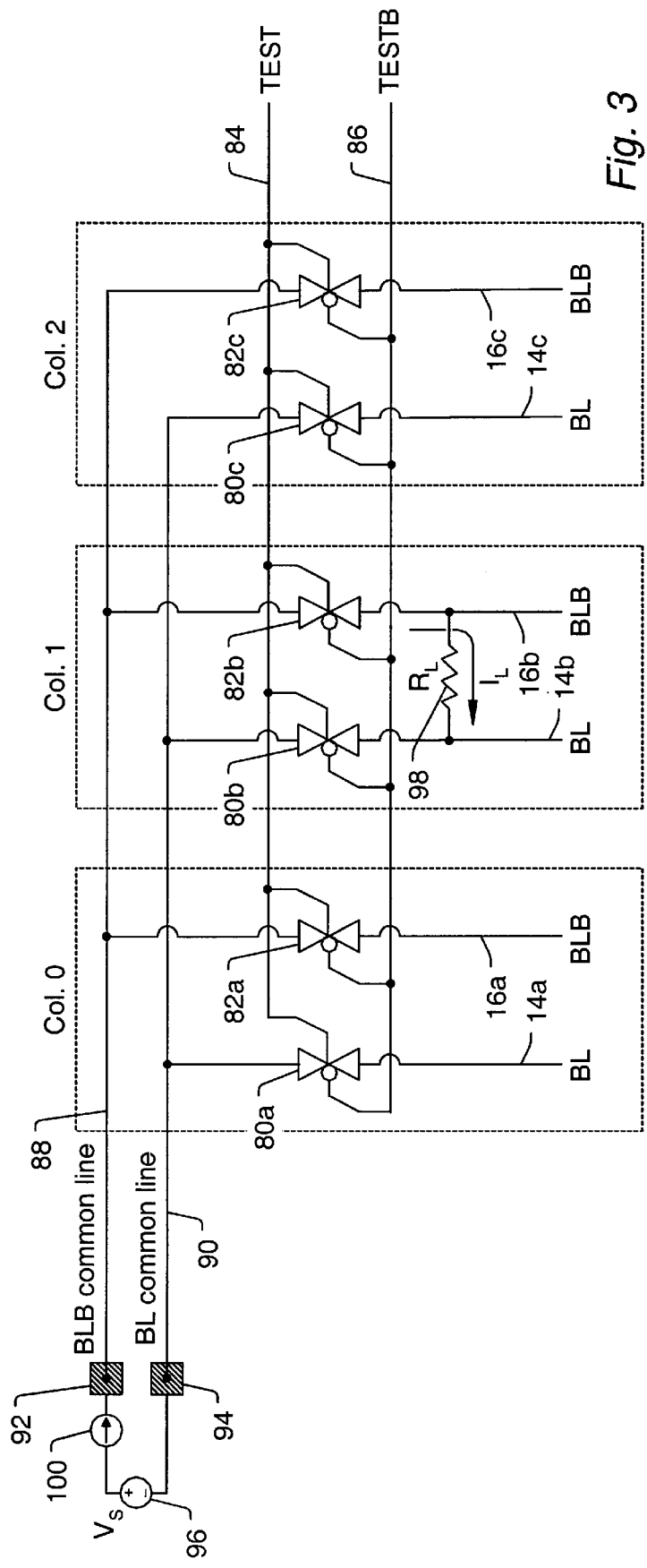
FIG. 3 shows a basic embodiment of the system disclosed herein.

A basic embodiment of the system disclosed herein for detection of this leakage resistance is presented in FIG. 3. For simplicity, FIG. 3 omits the memory cells and surrounding circuitry, and shows only the bit lines for 3 columns of the SRAM memory matrix. Circuit elements previously introduced in FIGS. 1 and 2 retain the same item numbers, with a letter appended to indicate the corresponding column. For example, complementary bit lines BL and BLB for column 1 of the memory are assigned item numbers 14b and 16b, respectively. In this embodiment, a BL common line 90 is provided for the BL bit lines (14a–c) of each column, and a BLB common line 88 for the BLB bit lines (16a–c). The BL and BLB common lines terminate in test pads 94 and 92, respectively. These complementary common lines may be added to the internal structure of the SRAM when it is fabricated, occupying the same level of metal as, for example, the bit lines. Alternatively, they may be subsequently overlaid onto the memory device—although this would typically be more costly. In the embodiment of FIG. 3, each BL bit line is connected to the BL common line 90 by a bi-directional switch (80a–c); similarly, each BLB bit line is connected to the BLB common line 88 by a bi-directional switch (82a–c). Such switches may be formed from parallel-connected complementary MOSFETs. Complementary test mode signals TEST 84 and TESTB 86 control the bi-directional switches to permit bit line-bit line leakage detection. When TEST 84 is High (and TESTB 86 is Low), the switches (80a–c and 82a–c) are all turned on, connecting the BL bit lines (14a–c) to the BL common line 90, and the BLB bit lines (16a–c) to the BLB common line 88.

Using the circuitry of FIG. 3, bit line-bit line leakage defects may be detected in the following manner. A precision low voltage source $V_S$ 96 is placed across the test pads 92 and 94. The TEST 84 and TESTB 86 control lines are then activated, causing all of the BL bit lines to be connected to BL common line 90 and all of the BLB bit lines to be connected to BLB common line 88. This creates a comb structure, the teeth of which are the alternating BL and BLB bit lines, and results in a voltage drop equal to $V_S$ between each BL/BLB bit line pair. If a leakage resistance $R_L$ 98 is present between adjacent bit lines 14b and 16b for example, a leakage current $I_L$ will be produced, which may be externally detected by current monitor 100 in series with the voltage source 96. If the leakage current exceeds some predetermined threshold value, one or more pairs of bit lines are assumed to be defective and the memory device is removed from the production line.

Figure 4A:
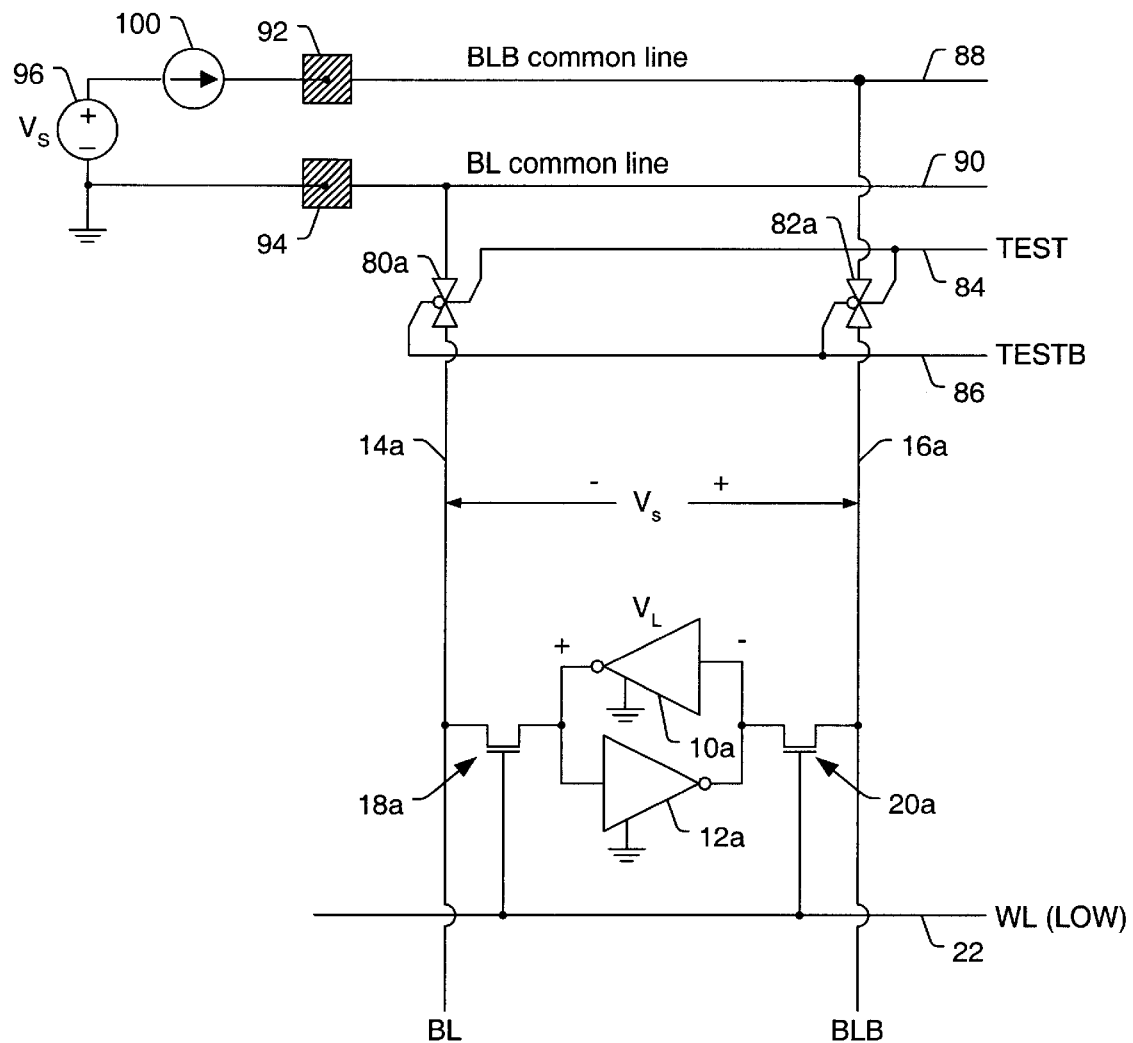
FIG. 4a contains a detailed view of a single memory cell and associated circuitry from the system of FIG. 3, illustrating the effect of sub-threshold leakage current.

FIG. 4a presents a detailed view of the leftmost column of the memory array illustrated in FIG. 3. The drawing shows one memory cell, together with the bit line switching arrangement described above in connection with FIG. 3. As before, recurring circuit components have the same item numbers as in previous drawings. The view shown in FIG. 4a may be used to discuss further details of the method disclosed herein for bit line-bit line leakage measurement.

It can be seen from FIG. 4a that the leakage measurement can only be made while the SRAM is powered up; otherwise, the bidirectional switches 80a and 82a would not function. While the SRAM is active, however, it is possible for inter-device leakage currents (e.g., sub-threshold leakage,. discussed below) to flow to and from the bit lines, interfering with the intended leakage measurement. Consider a situation in which $V_S$ has the polarity indicated in FIG. 4a, and the memory cell is in the logic state shown, with pass transistors 18a and 20a held off by a logic Low on word line (WL) 22. Thus, while the leakage measurement is made, the output of inverter 10a is, maintained in a High logic state and the output of inverter 12a in a Low logic state. This results in a voltage drop of $V_L$ across the bi-stable latch, as shown. Since bi-directional switches 80a and 82a are on during the leakage measurement, voltage source $V_S$ 96 is applied between the bit lines 14a and 16a, inducing a current, measured by current monitor 100. Neglecting small voltage losses in the inverters 10a and 12a and bi-directional switches 80a and 82a, a net voltage. of $V_S+V_L$ is created across the two pass transistors 18a and 20a; consequently, BLB 16a is more positive than the output of inverter 12a. This implies that there is a voltage drop across pass transistor 20a. Ideally, with its gate pulled Low, pass transistor 20a should present an infinite drain-to-source resistance. However, in practice, the voltage across transistor 20a will result in a small leakage current from BLB bit line 16a into inverter 12a. This effect is referred to as "sub-threshold leakage current," and is a basic physical limitation of all MOSFET transistors. While the sub-threshold leakage current for an individual memory cell may be inconsequential, the combined leakage current of thousands of cells in the memory array could impair the accuracy of the leakage current measurement, or even create a spurious fault indication.

Figure 4B:
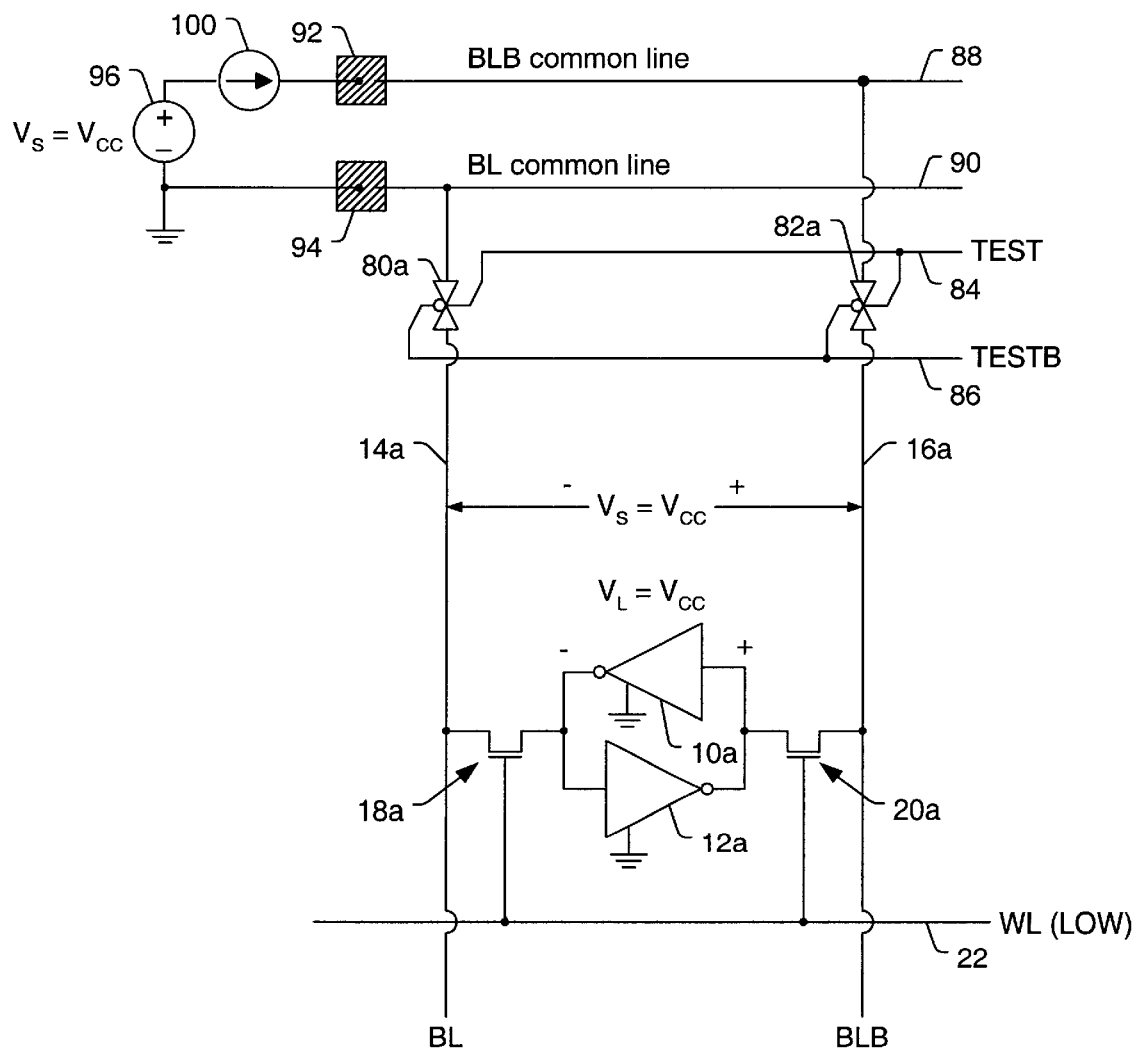
FIG. 4b presents the same detailed view as FIG. 4a, illustrating the use of a proper background pattern before testing for. bit line-bit line defects.

In order to prevent the effects of sub-threshold leakage current from interfering with the bit line-bit line leakage measurement in a memory having cells as shown in FIG. 4a, the memory cells must be set to a predefined state (i.e., a "background pattern" must be written to the memory cells) and voltage source $V_S$ chosen to match the voltage $V_L$ appearing across the bi-stable latch of the memory cell. With ideal inverters and other memory circuit components, this voltage approaches the supply voltage of the memory device (i.e., $V_L \equiv V_{CC}$). This is illustrated in FIG. 4b, in which the same memory components are shown as in FIG. 4a. In FIG. 4b, the bi-stable latch comprising inverters 10a and 12a is in the opposite state of FIG. 4a, and voltage source $V_S$ 96 is set to the memory supply voltage $V_{CC}$. As a result, the voltage $V_S$ between BL bit line 14a and BLB bit line 16a is equal to $V_{CC}$, with the polarity indicated. This voltage is effectively cancelled by the voltage between the outputs of inverters 10a and 12a. Ideally, the voltage drop across the pass transistors 18a and 20a is then zero, so there is no sub-threshold leakage current.

To apply this technique to the entire memory array:
(1) program all of the memory cells to the same state (uniform background pattern of all 1's or all 0's).
(2) set the voltage source $V_S$ to match the voltage $V_L$ appearing across the latch of the memory cell (which is approximately equal to the supply voltage $V_{CC}$ of the memory device), with the $V_S^-$ terminal connected to ground ($V_{SS}$) of the device.
(3) connect $V_S$ between the BL and BLB common lines, such that the $V_S^+$ terminal is connected to the bit line corresponding to the High side of each memory cell, and the $V_S^-$ terminal is connected to the bit line corresponding to the Low side of each memory cell.

With regard to step (2) of the above procedure, since the memory array contains numerous memory cells, whose electrical characteristics may vary, it is unlikely that a single voltage source $V_S$ can perfectly match the $V_L$ of all the cells. Therefore, the assumption is made that $V_L \equiv V_{CC}$ (or some slightly lower voltage, to account for losses), and the source voltage is set to this value. Generally, a residual voltage drop across the pass transistors 18a and 20a cannot be entirely eliminated. In addition, there are also leakage currents induced by switches 80a and 82a, which are proportional to supply voltage. Therefore, when making bit line-bit line leakage measurements, it is desirable to use as low a value of $V_{CC}$ as practical (typically, on the order of 1.5–2.0 V). This minimizes the residual voltage drop across the pass transistors, and further reduces sub-threshold leakage current. By employing these measures, it is believed that bit line-bit line defect detection will not be significantly impaired by the effects of inter-device leakage currents.

The embodiments of FIGS. 4a and 4b show a DC voltage source used for leakage detection. However, the use of bi-directional switches 80a and 82a permits the voltage source to be of either polarity, since the induced current can then flow in either direction through the memory cells. Note that the background pattern written to the memory cells should be inverted if the polarity of the voltage source is reversed, to minimize sub-threshold leakage effects. In one embodiment, a two-stage leakage test might be performed using both positive and negative source voltages. Such an embodiment might be useful in the event that any leakage-causing defects exhibited a voltage polarity dependence. In an alternate embodiment, unidirectional switches could be used for 80a and 82a, restricting the leakage test to the use of a single polarity. For example, if the polarity of $V_S$ were as shown in FIG. 4b, switch 82 could be replaced by a switch passing. current downward, and switch 80 with one passing current upward in the diagram of FIG. 4b. In still another embodiment, an AC voltage source may be used. This may advantageously allow the use of synchronous detection (with a lock-in amplifier) to measure extremely small leakage currents. Considerations involved in performing an AC measurement may include, for example, variation of the pattern written to the memory cells corresponding to variation in the test signal polarity, and adjustment of the shape of the test signal for consistency with that appearing across a memory cell.

During normal operation of the memory device it is important to connect the BL and BLB common lines to a fixed voltage; otherwise, read and write access timing for the memory becomes unpredictable. A further addition to the basic embodiment in FIG. 3 is the provision of shunt elements to prevent the BL and BLB common lines from "floating" when the SRAM is not being tested (i.e., when TEST 84 is Low and TESTB 86 is High). During such times, the shunt elements tie the common lines to either a High or Low logic level. In the embodiment shown in FIG. 5, this is accomplished by shunt (or "bleeder") transistors. These shunt transistors are active only when the SRAM is not in test mode, since TESTB 86 will then be High., During a leakage measurement, when TESTB 86 goes Low, the transistors 110 and 112 turn off, allowing the BL and BLB common lines to be driven by a source connected to test pads 92 and 94.

Figure 5:
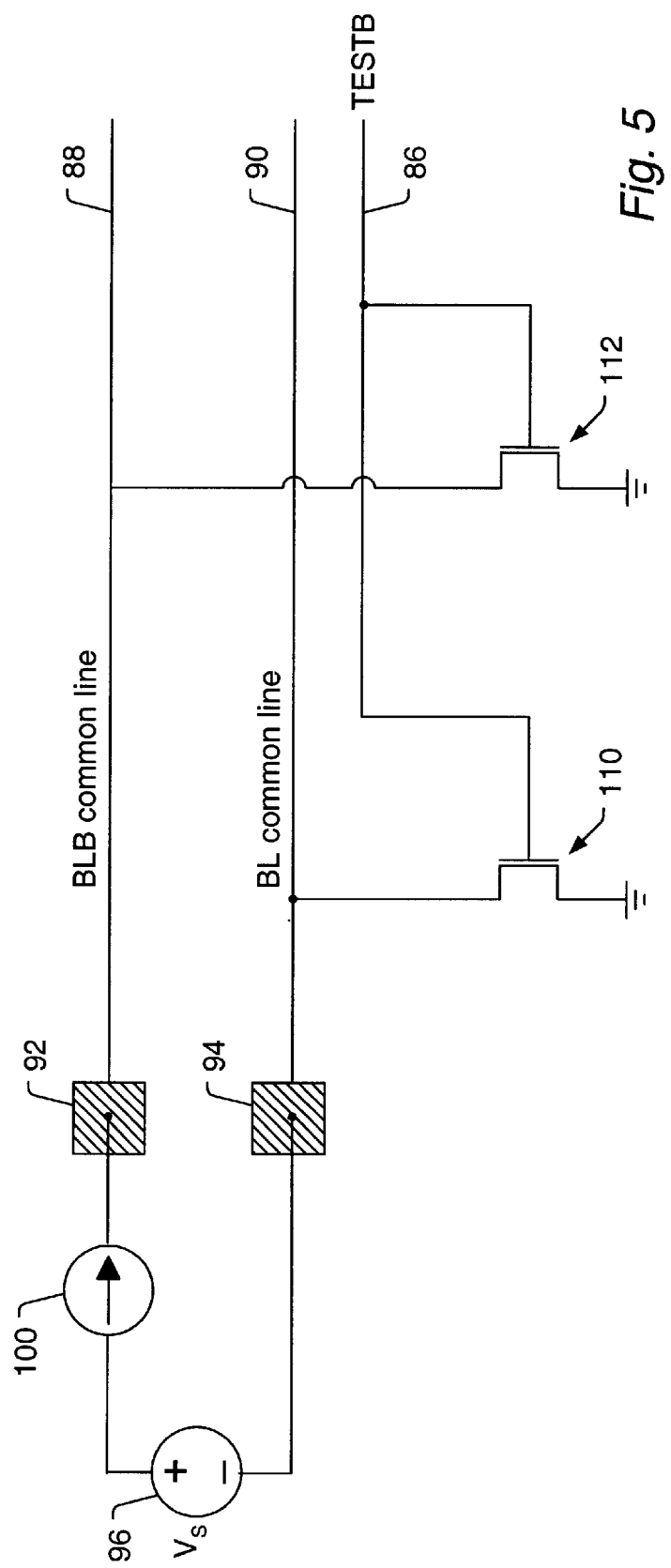
FIG. 5 illustrates the use of shunt transistors to clamp BL and BLB common lines to a fixed voltage when the memory device is not being tested.
Figure 6:
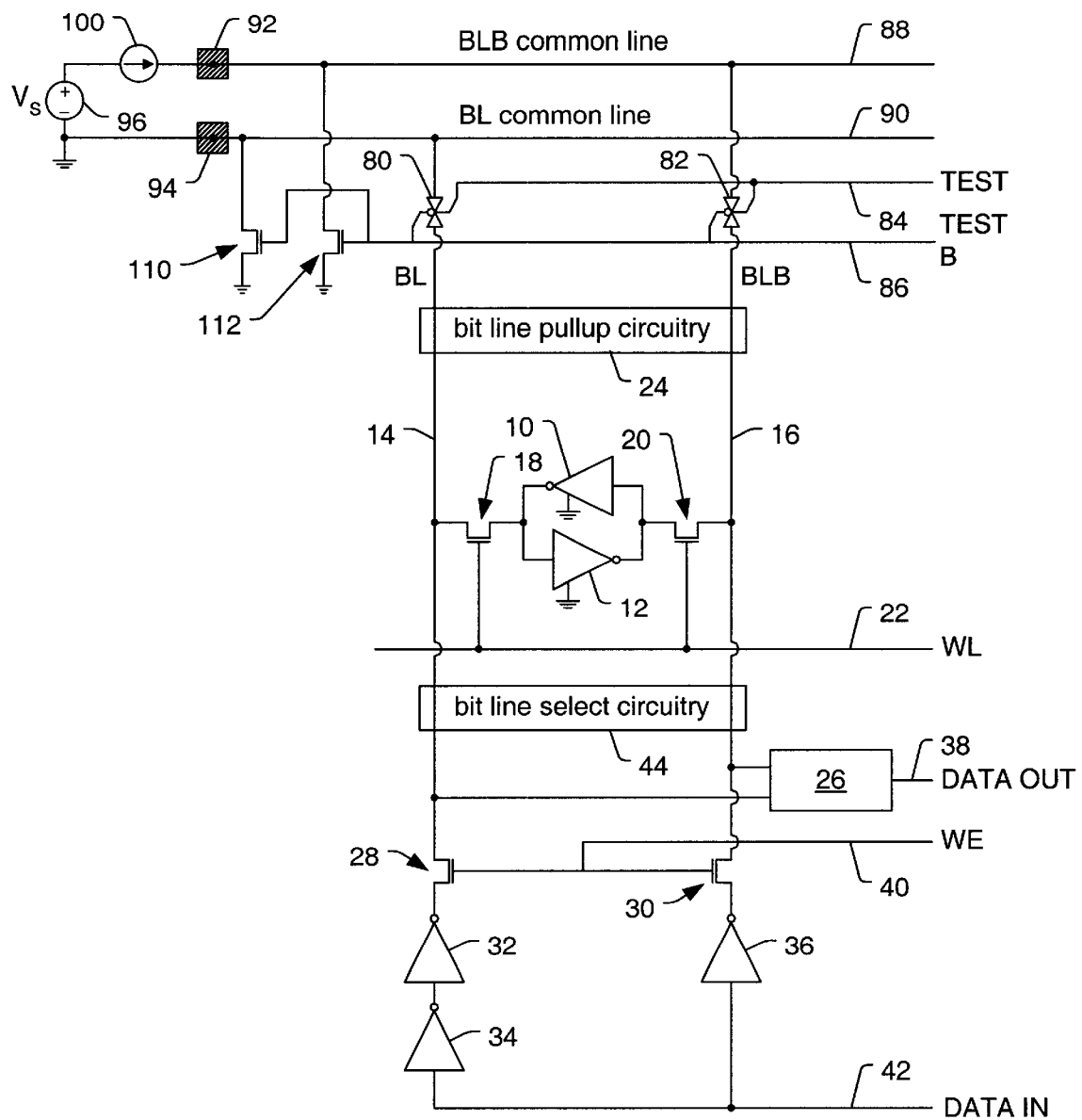
FIG. 6 illustrates a comprehensive embodiment of the system disclosed herein.

FIG. 6 shows a comprehensive embodiment of the system disclosed herein, incorporating the shunt transistors 110 and 112 of FIG. 5. As explained above, in normal use (when TEST 84 is Low and TESTB 86 is High), bidirectional switches 80 and 82 are off and transistors 110 and 112 are on. This allows BLB and BL common lines 88 and 90 to be pulled Low to prevent them from floating. Bit line select 44 and pull-up 24 circuitry biases the bit lines 14 and 16, and selects them when data are read from or written to the memory cell (10 and 12). During leakage testing, the bit line select 44 and pull-up 24 circuitry is disabled, using logic elements normally present in SRAMs. The bit lines are connected to the memory cell through pass transistors 18 and 20, which are activated by word line 22. The state of the memory cell is read by sense amplifier 26, which converts the differential voltage between the BL and BLB bit lines 14 and 16 to a logic output 38. Input data 42 are written to the memory cell using inverting buffer amplifiers 32, 34, and 36, which are enabled by pass transistors 28 and 30 when write enable (WE) line 40 is High. While voltage source $V_S$ 96 is applied between the BLB and BL common lines 88 and 90 via test pads 92 and 94, current monitor 100 measures the induced current. Alternatively, an internal voltage source within the memory device itself could be provided for this purpose; in this case, one would simply measure the current flowing from one test pad to the other with current monitor 100. For example, tristated drivers could be incorporated in the memory device and used to drive the BL and BLB common lines to VCC or ground.

Figure 7:
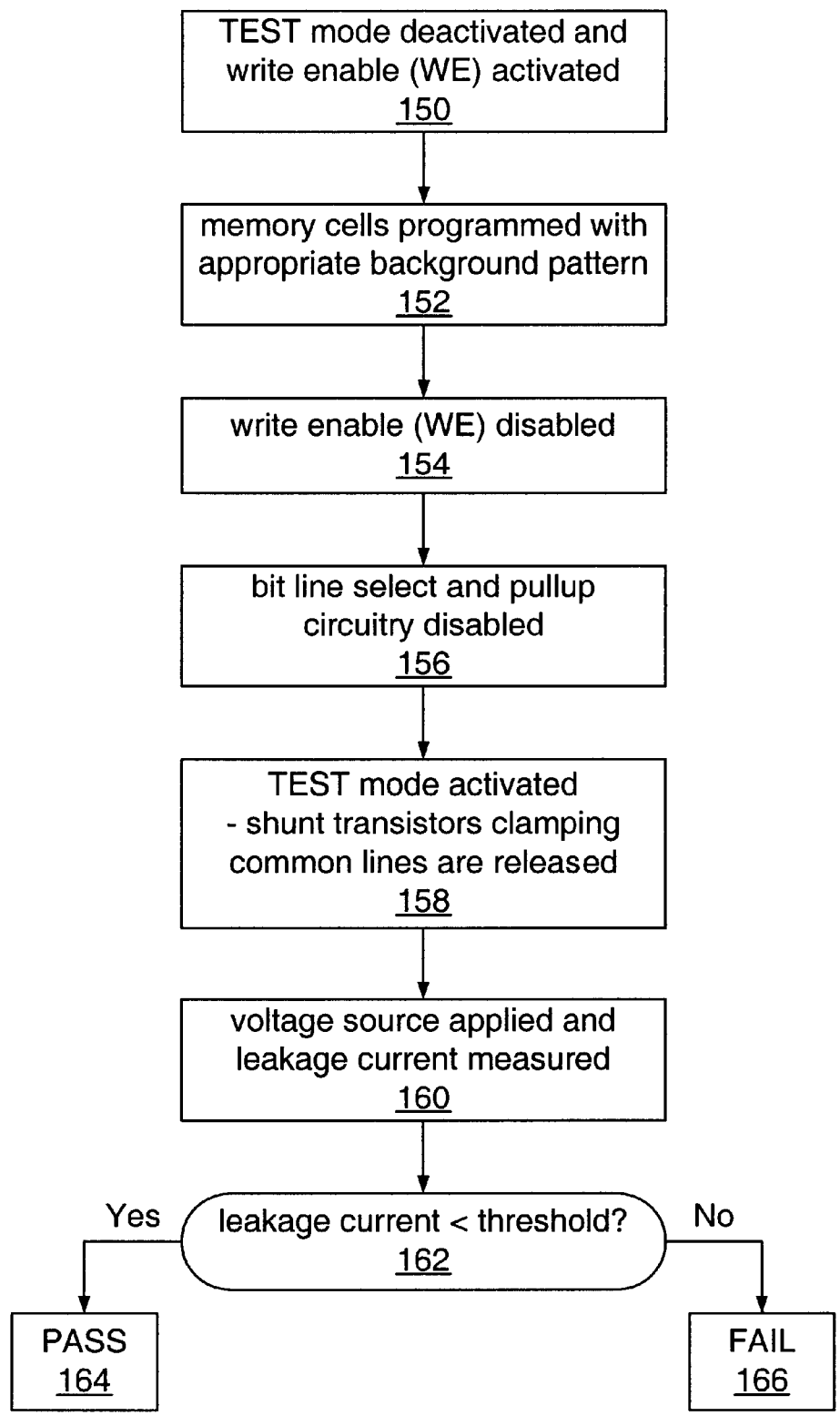
FIG. 7 contains a flowchart representing an embodiment of the method disclosed herein.

A flowchart of an embodiment of the method disclosed herein is presented in FIG. 7. The procedure represented in the flowchart begins with the memory device in normal operating mode 150—i.e., the TEST and TESTB control lines are inactive. This allows the appropriate background pattern to be written 152 to all the memory cells, as discussed in connection with FIGS. 4a and 4b. Memory writes are then disabled 154, by taking the write enable (WE) line Low. Next, the bit line select and pull-up circuitry, internal to the memory device and normally coupled to the bit lines, is disabled 156. When test mode is entered, the shunt transistors that clamp the BL and BLB common lines to a High or Low logic level are deactivated 158, allowing the common lines to be driven by an external (or internal) voltage source. The external (or internal) voltage source is applied across the BL and BLB common lines 160, and the resulting leakage current measured. If the measured current is within a predetermined level 162, the device is deemed good 164; otherwise, it is rejected 166.

The test procedure described in the flowchart of FIG. 7 may be performed during wafer sort. On the basis of the leakage test, defective memory devices on a given semiconductor wafer can be identified and removed from production before sectioning the wafer.

A conventional SRAM is easily adapted to permit bit line-bit line leakage testing according to the system and method disclosed herein. In the embodiment of FIG. 6, the components above the bit line select 44 and pull-up 24 circuitry are the only additional elements required. If the leakage current measurement is to be performed after packaging of a memory, a minimum of three additional device pins must also be provided on the SRAM device package: the two test pads 92 and 94, and an externally accessible TEST control signal 84. The slight increase in SRAM complexity may be justified by having the ability to screen parts with bit line-bit line defects in the wafer sort stage of production, since such screening may contribute to higher device yields and reduced production costs.

It will be appreciated to those skilled in the art having the benefit of this disclosure that the embodiments described are believed applicable to testing semiconductor memories during manufacturing. In devices with Built-In Self-Repair (BISR) capability, both regular and redundant portions of the memory may be tested. Furthermore, although illustrated with reference to SRAMs, the system and method disclosed herein may be adapted to any type of memory device containing adjacent bit lines, including dynamic random access memories (DRAMs), which typically use a single bit line per cell, rather than complementary pairs of bit lines. With such an adaptation, for example, the bit line-bit line leakage test could be performed with the memory cells programmed to have alternating values, rather than the uniform background pattern described above. Accordingly, the specification and drawings are to be regarded in an illustrative rather than a restrictive sense as to possibly numerous architectures, circuitry, and methodologies which fall within, the spirit and scope of the present invention.

What is claimed is:

1. A system for testing a semiconductor memory device, said system comprising:
   a first common line within the memory device, wherein the first common line is coupled to each of a first set of bit lines within an array of bit lines;
   a second common line within the memory device, wherein the second common line is coupled to each of a second set of bit lines within the array, and wherein the first and second sets of bit lines are interleaved such that one bit line of the second set is interposed between two adjacent bit lines of the first set;
   a voltage source adapted to apply a voltage between the first and second common lines;
   a current monitor, adapted to detect a current between the first and second common lines induced by the applied voltage; and
   a plurality of switches, wherein a first set of the switches is adapted to electrically connect each bit line of the first set of bit lines to the first common line only when a test signal is active, and wherein a second set of the switches is adapted to electrically connect each bit line of the second set of bit lines to the second common line only when the test signal is active.

2. The system as recited in claim 1, wherein each of the first set of bit lines is coupled to a first output of a respective memory cell within the memory device, and each of the second set of bit lines is coupled to a second output of the respective memory cell, and wherein the first output and second output of each cell provide complementary signals.

3. The system as recited in claim 1, further comprising first and second shunt devices adapted to couple the first and second common lines, respectively, to a predetermined logic level only when the test signal is not active.

4. The system as recited in claim 1, wherein the voltage source is external to the memory device.

5. The system as recited in claim 1, wherein the voltage source is within the memory device, and the leakage current is monitored via externally accessible test pads.

6. The system as recited in claim 1, wherein, prior to testing the semiconductor memory device, the polarity of each of the first set of bit lines with respect to the each of the second set of bit lines is the same as the polarity of the voltage source applied between the first and second common lines.

7. The system as recited in claim 1, wherein the semiconductor memory device further comprises a static random access memory (SRAM).

8. A method for testing a semiconductor memory device, said method comprising:
   coupling a first common line within the memory device to a first set of bit lines within the memory device only when a test signal is active;
   coupling a second common line within the memory device to a second set of bit lines within the memory device only when a test signal is active; and
   measuring a resistance between the first and second common lines.

9. The method as recited in claim 8, wherein said first and second sets of bit lines are interleaved, such that one bit line of the second set is interposed between two adjacent bit lines of the first set.

10. The method as recited in claim 8, wherein said coupling a first common line and a second common line comprise supplying a test signal to each of a first set of switches coupled between the first common line and each of the first set of bit lines, and supplying the test signal to each of a second set of switches coupled between the second common line and each of the second set of bit lines.

11. The method as recited in claim 8, wherein said measuring comprises:
   applying a voltage between the first and second common lines; and
   measuring any current induced between the first and second common lines by the applied voltage.

12. The method as recited in claim 11, wherein said applying a voltage and measuring any current comprise using equipment external to the memory device, coupled through output pads of the first and second common lines.

13. The method as recited in claim 11, wherein said applying a voltage comprises using a voltage source internal to the memory device.

14. The method as recited in claim 11, wherein:
   each of said first set of bit lines is coupled to first outputs of a corresponding column of SRAM memory cells;
   each of said second set of bit lines is coupled to complementary second outputs of the corresponding column of SRAM memory cells;
   each SRAM memory cell comprises a bi-stable latch; and
   said applying a voltage between the first and second common lines comprises applying a voltage substantially equal to that appearing across the bi-stable latch.

15. The method as recited in claim 14, further comprising storing the same logical value in all of the SRAM memory cells, prior to said applying a voltage.

16. The method as recited in claim 8, wherein:
   each of said first set of bit lines is coupled to outputs of a respective column within a first set of columns of single-output memory cells;
   each of a second set of bit lines is coupled to outputs of a respective column within a second set of columns of single-output memory cells;
   the first and second sets of columns are interleaved; and
   further comprising storing one logical value in all memory cells within the first set of columns, and the opposite logical value in all memory cells within the second set of columns, prior to said measuring a resistance.

17. The method as recited in claim 8, further comprising using first and second shunt devices to electrically disconnect the first and second common lines from said predetermined voltage reference, prior to said coupling the first common line to a first set of bit lines and coupling the second common line to a second set of bit lines.

18. The method recited in claim 8, wherein said measuring is performed prior to stress testing of the memory device.

19. A semiconductor memory device, comprising:
   an array of bit lines comprising interleaved first and second sets of bit lines, such that one bit line from the second set is interposed between any two adjacent bit lines from the first set;
   a first common line coupled to all of the bit lines within the first set;
   a second common line coupled to all of the bit lines within the second set; and
   a plurality of switches, wherein a first set of the switches is adapted to electrically connect each bit line of the first set of bit lines to the first common line only when a test signal is active, and wherein a second set of the switches is adapted to electrically connect each bit line of the second set of bit lines to the second common line only when the test signal is active.

20. The semiconductor memory device as recited in claim 19, wherein the first and second common lines comprise pads adapted to allow a measurement of resistance between the first and second common lines.

21. The semiconductor memory device as recited in claim 20, wherein the memory device is formed on an integrated circuit, further comprising a voltage source formed within the integrated circuit and adapted to apply a voltage between the first and second common lines, and wherein the pads are adapted to allow measurement of a current flowing between the first and second common lines.

22. The semiconductor memory device as recited in claim 19, further comprising a shunting element coupled to each common line, wherein the shunting element is adapted to couple the first and second common lines, respectively, to a predetermined logic level only when the test signal is not active.

* * * * *